(12) United States Patent
Chang et al.

(10) Patent No.: US 10,779,434 B2
(45) Date of Patent: Sep. 15, 2020

(54) BACKFLOW PREVENTION DEVICE AND SERVER SYSTEM USING THE SAME

(71) Applicant: Wistron Corporation, New Taipei (TW)

(72) Inventors: Tsung-Han Chang, New Taipei (TW); Hua Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 74 days.

(21) Appl. No.: 15/979,461

(22) Filed: May 15, 2018

(65) Prior Publication Data

US 2019/0254191 A1 Aug. 15, 2019

(30) Foreign Application Priority Data

Feb. 14, 2018 (TW) .............................. 107105436 A

(51) Int. Cl.
*H05K 7/20* (2006.01)

(52) U.S. Cl.
CPC ..... *H05K 7/20145* (2013.01); *H05K 7/20172* (2013.01); *H05K 7/20736* (2013.01)

(58) Field of Classification Search
CPC ........... H05K 7/20145; H05K 7/20172; H05K 7/20736; F16K 31/22
USPC ....................................................... 454/184
See application file for complete search history.

(56) References Cited

U.S. PATENT DOCUMENTS

| | | | |
|---|---|---|---|
| 3,466,819 A * | 9/1969 | Giger | E06B 7/14 52/1 |
| 4,104,004 A * | 8/1978 | Graef | F04B 53/06 137/202 |
| 4,655,247 A * | 4/1987 | Westra | E21B 21/10 137/519.5 |
| 5,509,445 A | 4/1996 | Couet | |
| 5,803,805 A * | 9/1998 | Sells | F24F 7/02 454/260 |
| 8,605,427 B2 * | 12/2013 | Chen | H01L 23/467 165/80.3 |
| 9,605,868 B2 * | 3/2017 | Carlyon | F24F 13/1426 |
| 9,777,736 B2 | 10/2017 | Shih et al. | |

(Continued)

FOREIGN PATENT DOCUMENTS

CN 103635065 3/2014

OTHER PUBLICATIONS

"Office Action of China Counterpart Application", dated Jun. 2, 2020, p. 1-p. 10.

*Primary Examiner* — Edelmira Bosques
*Assistant Examiner* — Dana K Tighe
(74) *Attorney, Agent, or Firm* — JCIPRNET

(57) ABSTRACT

A backflow prevention device includes at least one channeled body and at least one moving part. The at least one channeled body includes at least one first opening and at least one second opening. Each of the at least one channeled body gradually enlarges from each of the at least one first opening to each of the at least one second opening. Each of the at least one moving part is movably disposed in each of the at least one channeled body. A size of the moving part is less than a size of the second opening. When an airflow back flows from the second opening to the first opening, the airflow drives the moving part to enable the moving part to block the first opening. A server system is also disclosed.

20 Claims, 9 Drawing Sheets

(56) References Cited

U.S. PATENT DOCUMENTS

| | | | |
|---|---|---|---|
| 2008/0151490 A1* | 6/2008 | Fan | G06F 1/20 |
| | | | 361/679.47 |
| 2013/0044430 A1* | 2/2013 | Carl, Jr. | H05K 7/20772 |
| | | | 361/695 |
| 2014/0342652 A1* | 11/2014 | Dong | F24F 7/007 |
| | | | 454/184 |

* cited by examiner

BACKFLOW PREVENTION DEVICE AND SERVER SYSTEM USING THE SAME

CROSS-REFERENCE TO RELATED APPLICATION

This application claims the priority benefit of Taiwan application serial no. 107105436, filed on Feb. 14, 2018. The entirety of the above-mentioned patent application is hereby incorporated by reference herein and made a part of this specification.

BACKGROUND

Technical Field

The disclosure relates to a backflow prevention device applied to a server. More particularly, the disclosure relates to a backflow prevention device and a server system using the backflow prevention device.

Description of Related Art

In recent years, as performance of servers advances, heating power of electronic parts used in the servers increases as well. In order to prevent malfunction of the electronic parts caused by overheating, the servers require sufficient heat dissipation performance for the electronic parts. For instance, heat dissipation modules, such as heat dissipation fans, may be additionally installed to the server to dissipate heat for the electronic part. Nevertheless, the fans in the server may mismatch with each other, and backflow is thus easily generated, which may lead to malfunction of the heat dissipation capability of the heat dissipation modules. The server may be overheated and damaged consequently.

SUMMARY

In an embodiment of the disclosure, a backflow prevention device includes at least one channeled body and at least one moving part. Each of the at least one channeled body includes at least one first opening and at least one second opening.

Each of the at least one channeled body gradually enlarges from each of the at least one first opening to each of the at least one second opening. Each of the at least one moving part is movably disposed in each of the at least one channeled body. A size of the at least one moving part is greater than a size of the at least one first opening. In addition, the size of the at least one moving part is less than a size of the at least one second opening. When an airflow back flows from each of the at least one second opening to each of the at least one first opening of the at least one channeled body, the airflow drives each of the at least one moving part to enable each of the at least one moving part to block each of the at least one first opening.

In an embodiment of the disclosure, the at least one channeled body further includes at least one third opening. Each of the at least one first opening is located between each of the at least one second opening and each of the at least one third opening. Each of the at least one channeled body gradually shrinks from each of the at least one third opening to each of the at least one first opening.

In an embodiment of the disclosure, a diameter of each of the at least one second opening and a diameter of each of the at least one third opening are R1, a diameter of each of the at least one first opening is R2, and 0.4R1≤R2≤0.6R1.

In an embodiment of the disclosure, a slope of the at least one channeled body from each of the at least one second opening to each of the at least one first opening or from each of the at least one third opening to each of the at least one first opening is between 0.7 and 1.43.

In an embodiment of the disclosure, the backflow prevention device further includes at least one supporting piece. Each of the at least one channeled body has at least one first channel. Each of the at least one first channel is connected to the corresponding at least one first opening and the corresponding at least one second opening. Each of the at least one supporting piece is disposed in the corresponding at least one first channel. Each of the at least one supporting piece surrounds a second channel. The second channel corresponds to the at least one first opening and extends towards the at least one second opening and is coaxial with the corresponding at least one first opening. A plurality of through holes are formed on each of the at least one supporting piece. The through holes enable the second channel of each of the at least one supporting piece to be connected to the corresponding at least one first channel. Each of the at least one moving part is movably disposed in the corresponding second channel.

In an embodiment of the disclosure, the backflow prevention device further includes at least one stopper. The at least one stopper is disposed on the at least one channeled body and is located next to the at least one second opening. Each of the at least one stopper includes a ventilator. The at least one moving part is adapted to be restrained by the at least one stopper and that is not detached from the at least one channeled body from the at least one second opening.

In an embodiment of the disclosure, each of the at least one moving part is a sphere, a cone, or a disk.

In an embodiment of the disclosure, the backflow prevention device further includes a frame. The frame includes a plurality of accommodating slots. The at least one channeled body includes a plurality of channeled bodies. The at least one moving part includes a plurality of moving parts. The moving parts are disposed in the channeled bodies. The channeled bodies and the moving parts are replaceably inserted in the accommodating slots. A number of the accommodating slots is greater than a number of the channeled bodies.

In an embodiment of the disclosure, the accommodating slots include a first accommodating slot and a second accommodating slot. A size of the first accommodating slot is greater than a size of the second accommodating slot. The channeled bodies include a first channeled body and a second channeled body. A size of the first channeled body is greater than a size of the second channeled body.

In an embodiment of the disclosure, a main body of the at least one channeled body is one channeled body. The at least one channeled body further includes at least one third opening. The at least one first opening is located between the at least one second opening and the at least one third opening. The at least one first opening, the at least one second opening, and the at least one third opening respectively include a plurality of first openings, a plurality of second openings, and a plurality of third openings. The first openings, the second openings, and the third openings are formed on the at least one channeled body.

In an embodiment of the disclosure, a server system includes a housing, a flow inlet, a main board, a fan, and the backflow prevention device as described above. The flow inlet is disposed in the housing. The main board is disposed in the housing. The fan is disposed in the housing near the flow inlet. The fan includes an outflow side, and the main board is located next to the outflow side. The backflow prevention device is disposed in the housing and is disposed at the outflow side of the fan.

In an embodiment of the disclosure, the at least one channeled body of the backflow prevention device further includes at least one third opening. Each of the at least one first opening is located between each of the at least one second opening and each of the at least one third opening. Each of the at least one channeled body gradually shrinks from each of the at least one third opening to each of the at least one first opening.

In an embodiment of the disclosure, a diameter of each of the at least one second opening and a diameter of each of the at least one third opening are R1, a diameter of each of the at least one first opening is R2, and $0.4R1 \leq R2 \leq 0.6R1$.

In an embodiment of the disclosure, a slope of the at least one channeled body from each of the at least one second opening to each of the at least one first opening or from each of the at least one third opening to each of the at least one first opening is between 0.7 and 1.43.

In an embodiment of the disclosure, the backflow prevention device further includes at least one supporting piece. Each of the at least one channeled body has at least one first channel. Each of the at least one first channel is connected to the corresponding at least one first opening and the corresponding at least one second opening. Each of the at least one supporting piece is disposed in the corresponding at least one first channel. Each of the at least one supporting piece surrounds a second channel. The second channel corresponds to the at least one first opening and extends towards the at least one second opening and is coaxial with the corresponding at least one first opening. A plurality of through holes are formed on each of the at least one supporting piece. The through holes enable the second channel of each of the at least one supporting piece to be connected to the corresponding at least one first channel. Each of the at least one moving part is movably disposed in the corresponding second channel.

In an embodiment of the disclosure, the backflow prevention device further includes at least one stopper. The at least one stopper is disposed on the at least one channeled body and is located next to the at least one second opening. Each of the at least one stopper includes a ventilator. The at least one moving part is adapted to be restrained by the at least one stopper and that is not detached from the at least one channeled body from the at least one second opening.

In an embodiment of the disclosure, each of the at least one moving part is a sphere, a cone, or a disk.

In an embodiment of the disclosure, the backflow prevention device further includes a frame. The frame includes a plurality of accommodating slots. The at least one channeled body includes a plurality of channeled bodies. The at least one moving part includes a plurality of moving parts. The moving parts are disposed in the channeled bodies. The channeled bodies and the moving parts are replaceably inserted in the accommodating slots. A number of the accommodating slots is greater than a number of the channeled bodies.

In an embodiment of the disclosure, the accommodating slots include a first accommodating slot and a second accommodating slot. A size of the first accommodating slot is greater than a size of the second accommodating slot. The channeled bodies include a first channeled body and a second channeled body. A size of the first channeled body is greater than a size of the second channeled body.

In an embodiment of the disclosure, a main body of the at least one channeled body is one channeled body. The at least one channeled body further includes at least one third opening. The at least one first opening is located between the at least one second opening and the at least one third opening. The at least one first opening, the at least one second opening, and the at least one third opening respectively include a plurality of first openings, a plurality of second openings, and a plurality of third openings. The first openings, the second openings, and the third openings are formed on the at least one channeled body.

To sum up, the backflow prevention device provided by the embodiments of the disclosure includes the channeled body and the moving part. The channeled body gradually enlarges from the first opening to the second opening. The moving part is moveably disposed in the channeled body between the first opening and the second opening. The size of the moving part is less than the size of the second opening. As such, when the airflow flows from the second opening back to the first opening, the moving part may be pushed by the airflow towards the first opening to block the first opening. Therefore, an additional active switch is not required to be disposed on the moving part to prevent flowing of the airflow and to prevent backflow from being generated. It thus can be seen that simplified design is provided and manufacturing costs are reduced. The server system using the backflow prevention device may precisely control the flow direction and amount of flow of the airflow, effectively remove heat energy, and increase service life and performance of the server system.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
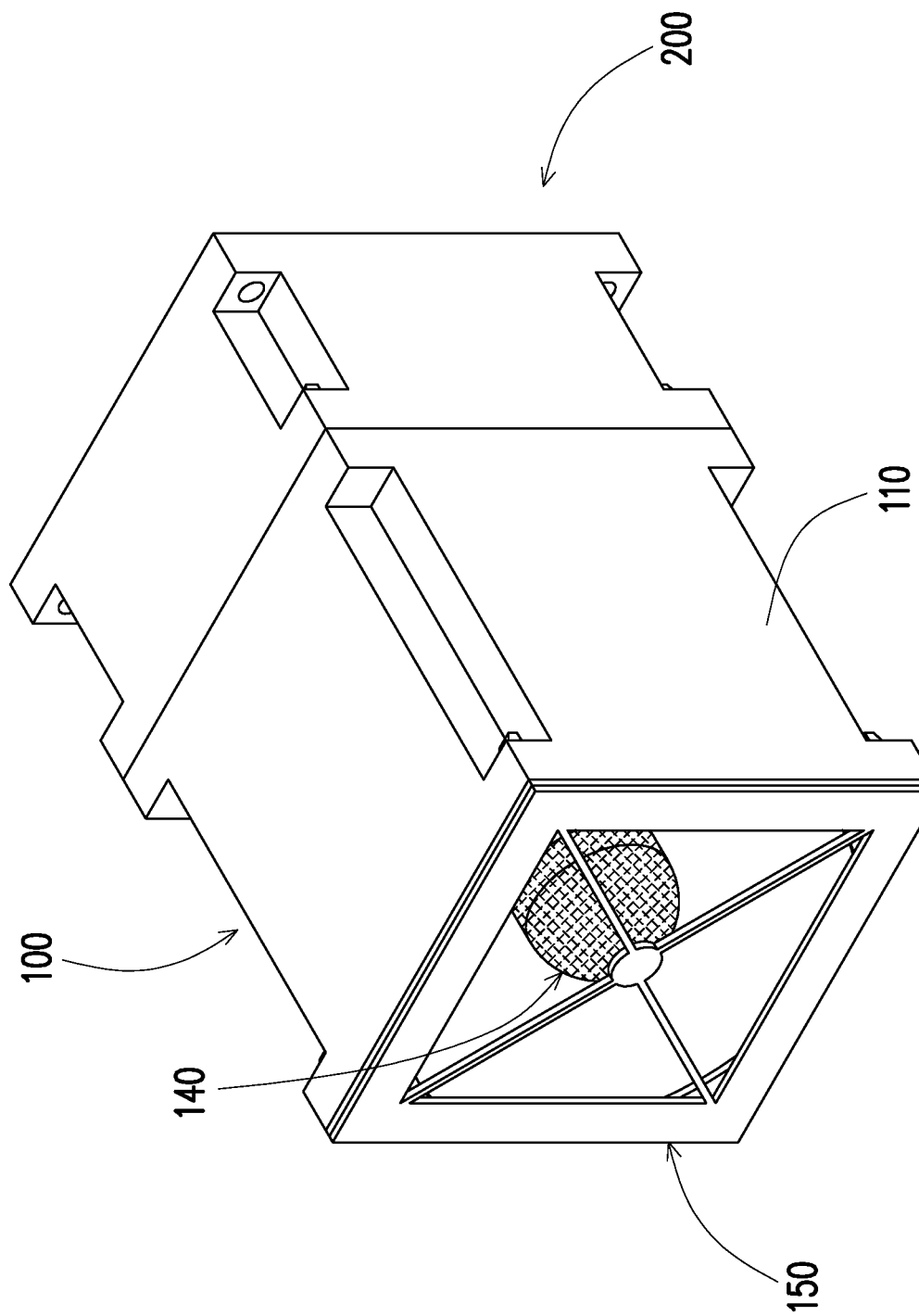
FIG. 1 is a schematic three-dimensional view illustrating a backflow prevention device and a fan according to an embodiment of the disclosure.
Figure 2:
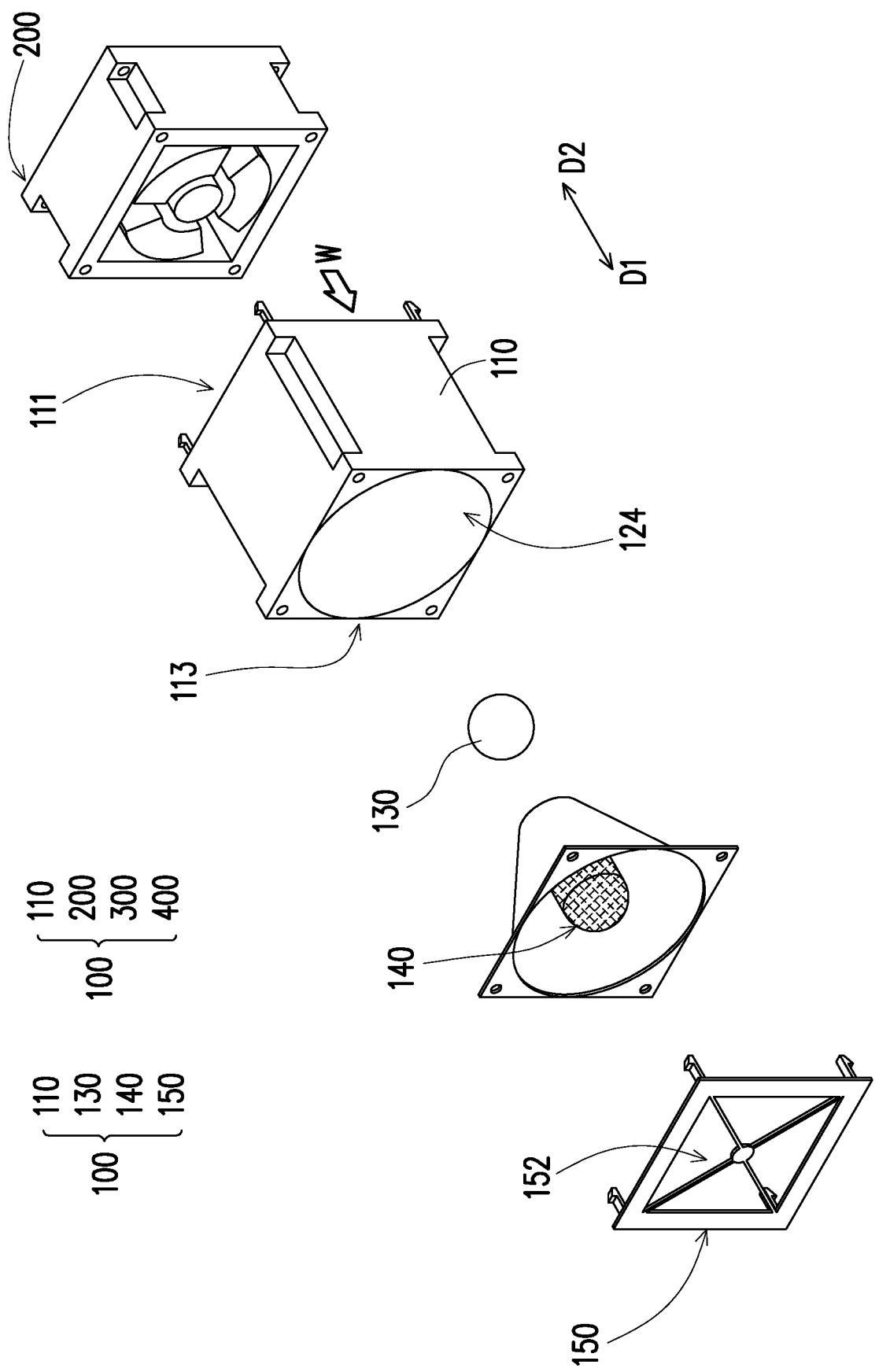
FIG. 2 is a schematic three-dimensional exploded view illustrating the backflow prevention device and the fan of FIG. 1.
Figure 3:
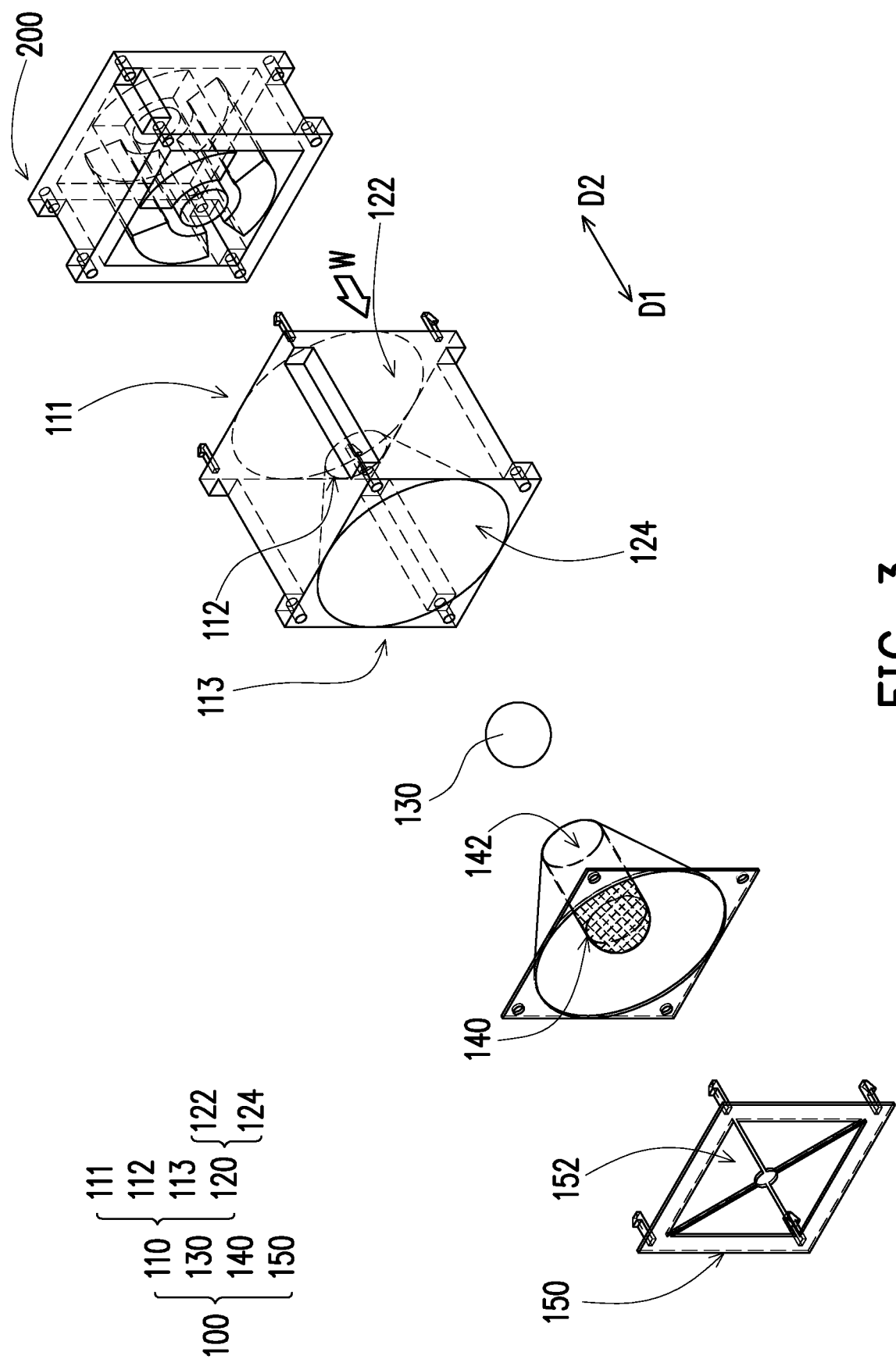
FIG. 3 is a three-dimensional exploded perspective view illustrating the backflow prevention device and the fan of FIG. 1.

FIG. 1 is a schematic three-dimensional view illustrating a backflow prevention device and a fan according to an embodiment of the disclosure. FIG. 2 is a schematic three-dimensional exploded view illustrating the backflow prevention device and the fan of FIG. 1. FIG. 3 is a three-dimensional exploded perspective view illustrating the backflow prevention device and the fan of FIG. 1. With reference to FIG. 1, a backflow prevention device 100 of the embodiments of the disclosure is adapted to be coupled to a fan 200 and thus is capable of preventing gas backflow. The backflow prevention device 100 includes a channeled body 110, a moving part 130 (shown in FIG. 2 and FIG. 3), a supporting piece 140, and a stopper 150. Note that in the accompanying drawings, thicknesses of components, regions and so on are exaggerated for clarity. Exemplary embodiments are described herein with reference to schematic cross-sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but are to include deviations in shapes that result, for example, from manufacturing. That is, the regions shown in the drawings are schematic in nature, and their shapes are not intended to show the exact shape of the regions, and are not intended to limit the scope of the claims.

With reference to FIG. 1, FIG. 2, and FIG. 3, the channeled body 110 includes a first opening 112 and a second opening 113 in this embodiment. To be specific, the channeled body 110 of this embodiment further includes a third opening 111, and the first opening 112 is located between the second opening 113 and the third opening 111 (shown in FIG. 3). For instance, the third opening 111 is, for example, located on a surface of the channeled body 110 adjacent to the fan 200, and the second opening 113 is, for example, located on a surface of the channeled body 110 away from the fan 200. As shown in FIG. 2 and FIG. 3, the channeled body 110 may gradually enlarge from the first opening 112 to the second opening 113 and gradually shrink from the third opening 111 to the first opening 112.

For instance, the channeled body 110 includes a first portion 122 located between the first opening 112 and the third opening 111 and a second portion 124 located between the first opening 112 and the second opening 113. The first opening 112 is adapted to be connected to the first portion 122 and the second portion 124. For instance, the first portion 122 may be, for example, a channel between the first opening 112 and the third opening 111. The second portion 124 may be, for example, a channel between the first opening 112 and the second opening 113. The first opening 112 between the first portion 122 and the second portion 124 is connected to the first portion 122 and the second portion 124. That is, the first portion 122 and the second portion 124 act as an integrally-connected channel 120.

Figure 4A:
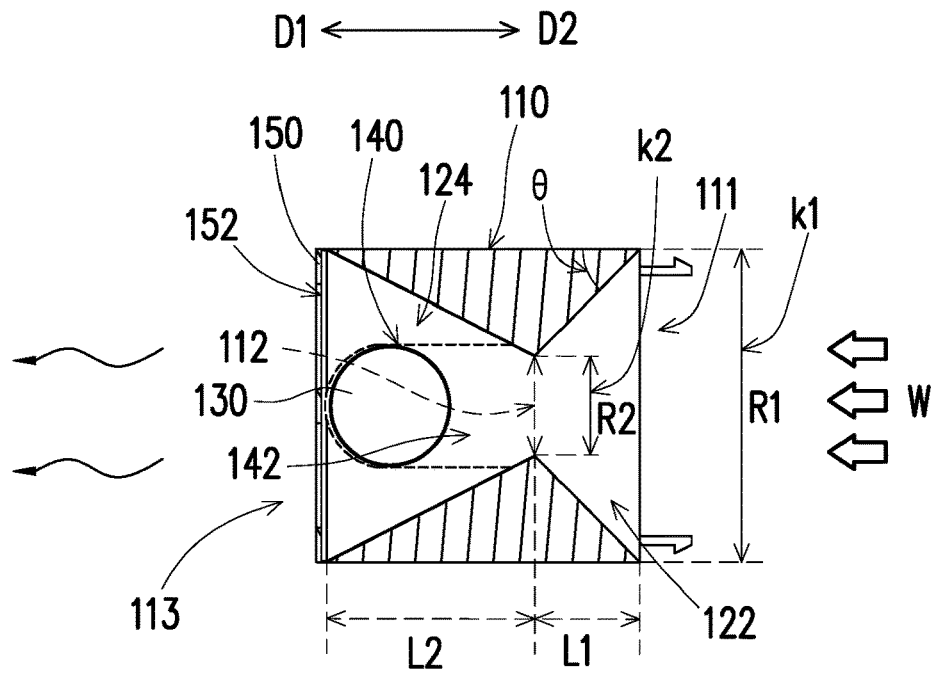
FIG. 4A is a schematic cross-sectional view illustrating an airflow entering from the third opening in the backflow prevention device of FIG. 1.

FIG. 4A is a schematic cross-sectional view illustrating an airflow entering from the third opening in the backflow prevention device of FIG. 1. With reference to FIG. 1, FIG. 3, and FIG. 4A, taking a distance L1 between the third opening 111 and the first opening 112 for example, the distance L1 is less than a distance L2 between the first opening 112 and the second opening 113 in this embodiment. Nevertheless, the disclosure should not be construed as limited thereto. In the first portion 122, the channeled body 110 gradually shrinks from the third opening 111 to the first opening 112. In the second portion 124, the channeled body 110 gradually enlarges from the first opening 112 to the second opening 113. For instance, when the channeled body 110 extends from the third opening 111 towards the first opening 112, the first portion 122 gradually shrinks and thus forms a gradually-shrinking inclined surface on the channeled body 110. In other words, the first portion 122 gradually shrinking from the third opening 111 to the first opening 112 is presented as a funnel shape in a side view (as shown in FIG. 4A). Besides, when the channeled body 110 extends from the first opening 112 towards the second opening 113, the second portion 124 gradually enlarges and thus forms a gradually-enlarging inclined surface on the channeled body 110. That is, the second portion 124 gradually enlarging from the first opening 112 to the second opening 113 is also presented as a funnel shape in the side view (as shown in FIG. 4A). Based on the above, in this embodiment, an airflow W first passes through the gradually-shrinking first portion 122 when entering the channel 120 of the channeled body 110 from the third opening 111, the airflow W then enters the second portion 124 from the first opening 112, passes through the gradually-enlarging second opening 124, and finally flows out of the channel 120 from the second opening 113. That is, the airflow W flows in a first direction D1 along the third opening 111 towards the second opening 113.

With reference to FIG. 4A, a diameter k1 of the third opening 111 is R1 in this embodiment. A diameter k2 of the corresponding first opening 112 is R2, and 0.4R1≤R2≤0.6R1. That is, the diameter k2 of the first opening 112 is less than the diameter k1 of the third opening 111. Besides, the diameter k2 of the first opening 112 is less than a diameter (not shown) of the second opening 113 as well. In this embodiment, a size of the diameter of the second opening 113 may selectively be identical to a size of the diameter k1 of the third opening 111. In other words, the diameter of the second opening 113 may be R1, which should however not be construed as limitations to the disclosure. In other embodiments, the size of the diameter of the second opening 113 may be different from the size of the diameter k1 of the third opening 111.

In this embodiment, a slope of the channeled body 110 from the second opening 113 to the corresponding first opening 112 or from the third opening 111 to the corresponding first opening 112 is between 0.7 and 1.43. For instance, the slope is, for example, a degree of inclination of the inclined surface of the first portion 122 connecting between the third opening 111 and the first opening 112. Further, an angle θ is provided between the inclined surface located at the first portion 122 and an outer contour of the channeled body 111 at the third opening 111. Nevertheless, the disclosure should not be construed as limited thereto. In other embodiments, the angle θ may also be provided between the inclined surface located at the second portion 124 and the outer contour of the channeled body 111 at the second opening 113. The angle θ may be obtained through calculating the slope. For instance, when tan θ=0.7 to 1.43, the angle θ is, for example, between 35 degrees and 55 degrees. In a preferred embodiment of the disclosure, the angle θ is, for example, 45 degrees, which should however not be construed as limitations to the disclosure. When the slope is between 0.7 and 1.43, the airflow W may pass through the first opening 112 effectively through the first portion 122 to enter the second portion 124, and a length of the channeled body 110 may also be reduced, and that the slim design of the backflow prevention device 100 is achieved. As such, the backflow prevention device 100 is suitable for being applied to the fan 200 or being applied in other electronic devices (e.g., a server system 10 shown in FIG. 7).

Note that the moving part 130 included in the backflow prevention device 110 is movably disposed in the channel 120 corresponding to the second portion 124. A size of the moving part 130 is less than the size of the diameter (not shown) of the corresponding second opening 113 and is greater than the size of the diameter k2 of the corresponding first opening 112. For instance, the moving part 130 is, for example, a sphere as shown in FIG. 2, FIG. 3, and FIG. 4A. Nevertheless, the disclosure should not be construed as limited thereto. A diameter of the moving part 130 is less than a size of the second opening 113 and is greater than a size of the first opening 112. Hence, the moving part 130 can only move in the corresponding second portion 124 and does not pass through the first opening 112 to enter the first portion 122.

Figure 4B:
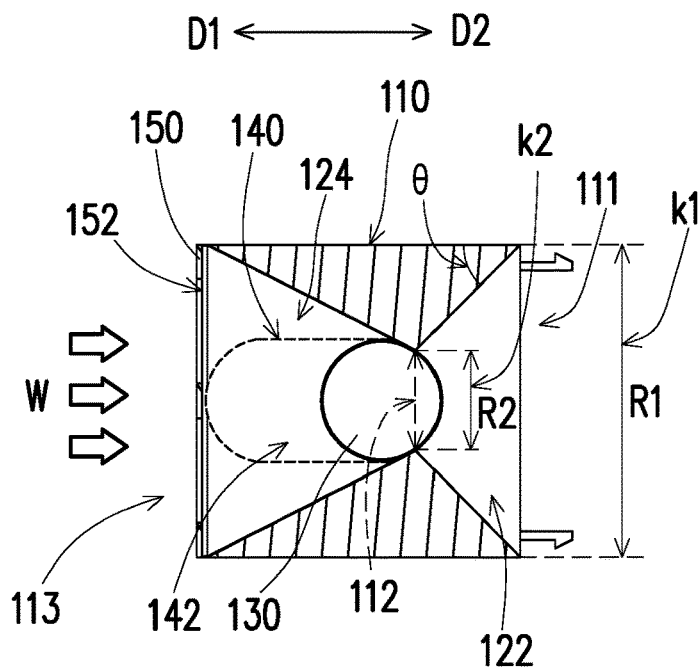
FIG. 4B is a schematic cross-sectional view illustrating the airflow entering from the second opening in the backflow prevention device of FIG. 1.

FIG. 4B is a schematic cross-sectional view illustrating the airflow entering from the second opening in the backflow prevention device of FIG. 1. With reference to FIG. 4A and FIG. 4B, when the airflow W enters the channel 120 of the corresponding first portion 122 from the third opening 111 of the channeled body 110, the corresponding moving part 130 is driven by the airflow W to move away from the first opening 112 as shown in FIG. 4A. For instance, when the airflow W enters the first portion 122 from the third opening 111, the airflow W passes through the first opening 112 in the first direction D1 and enters the second portion 124 in this embodiment. At this time, the airflow W flowing from the first opening 112 towards the second opening 113 pushes the moving part 130 disposed in the second portion 124 to move in the first direction D1 and thus pushes the moving part 130 further away from the first opening 112. Next, the airflow W flows out of the channeled body 110 from the second opening 113 and that an outflow is generated. As shown in FIG. 4B, when the airflow W back flows from the second opening 113 of the channeled body 110 and enters the channel 120 of the corresponding second portion 124, the airflow W may back flows to the first opening 112 and thus drives the corresponding moving part 130 to block the first opening 112. For instance, in this embodiment, when backflow is generated by the airflow W flowing out of the second opening 113, the airflow W enters the second portion 124 from the second opening 113, and the airflow W flows towards the first opening 112 in a second direction D2 opposite to the first direction D1. When the backflow generated by the airflow W is strong enough, the airflow W can push the moving part 130 to move in the second direction D2 and push the moving part 130 to be adjacent to the first opening 112, and that the moving part 130 may block the first opening 112.

In this way, in the backflow prevention device 100 of this embodiment, a shape design of the channel 120 of the channeled body 110 and the size of the moving part 130 relative to the first opening 112 and the second opening 113 may allow the first opening 112 to be open or to be blocked as affected by the flowing direction of the airflow W. As such, air outflow at the second opening 113 is prevented from being affected by the backflow of the airflow. Therefore, after strong backflow is generated by the airflow W, the moving part 130 may block the first opening 112 to stop the flowing of the airflow W, so as to prevent subsequent backflow from being generated. Besides, an active switch is not required to be additionally disposed in the backflow prevention device 100, and backflow can be prevented from being generated through the flowing direction of the airflow W. Therefore, the design of the backflow prevention device 100 may be simplified, and manufacturing costs may also be reduced.

With reference to FIG. 2, FIG. 3, FIG. 4A, and FIG. 4B, the backflow prevention device 100 selectively includes at least one supporting piece 140 in this embodiment. Each of the at least one supporting piece 140 is disposed in the channel 120 of the corresponding second portion 124. For instance, the supporting piece 140 is disposed in the channeled body 110 and is located at the second portion 124 between the corresponding first opening 112 and the second opening 113. Note that a portion of the channel 120 connecting between the first opening 112 and the second opening 113 may be called as a first channel (not shown). Moreover, the first channel specifically corresponds to the second portion 124, and that the first channel and the second portion 124 are substantially identical. The first channel is not additionally illustrated for clarity.

In this embodiment, a second channel 142 is surrounded in the first channel by the supporting piece 140. The second channel 142 surrounded by the supporting piece 140 is, for example, cylindrical-shaped, which should however not be construed as limitations to the disclosure. A plurality of through holes (not shown, presented by the mesh shapes in FIG. 2 and FIG. 3 and the dashed lines in FIG. 4A and FIG. 4B) are forming on each of the at least one supporting piece 140. For instance, the supporting piece 140 may be a meshed structure, which should however not be construed as limitations to the disclosure. In this way, the second channel 142 may be connected to the corresponding second portion 124 (i.e., the first channel) through the through holes of the supporting piece 140. That is, a space of the second channel 142 and a space of the second portion 124 (i.e., the first channel) are inter-connected. As such, the airflow W may freely flow from the second channel 142 towards the first channel or from the first channel towards the second channel 142.

In an embodiment, the supporting piece 140 may be formed by stamping, cutting, or/and collaging a sheet-like structure (not shown) formed by a web. For instance, through stamping, cutting, or/and collaging the sheet-like structure formed by the web, a funnel portion (not shown) as shown in FIG. 2 is formed and the second channel 142 portion is surrounded. As such, the second channel 142 portion surrounded by the supporting piece 140 and the funnel portion may be integrally formed, and the through holes are evenly distributed thereon. The funnel portion and the inclined surface of the second portion 124 are conformally disposed, as such, the supporting piece 140 is disposed in the second portion 124.

Nevertheless, the disclosure should not be construed as limited thereto. Since the funnel portion is attached to the inclined surface of the second portion 124, the through holes are on required to be disposed on the funnel portion to allow the airflow to pass through. Therefore, in an embodiment, only a portion of the supporting piece 140 surrounding the second channel 142 is formed based on the mesh structure or is formed based on a structure with the through holes. The funnel portion is not formed based on the mesh structure or does not have the through holes. That is, in the embodiments, only the portion of the supporting piece 140 surrounding the second channel 142 is required to be the mesh structure or to have the through holes, so as to enable the second channel 142 to be connected to the corresponding second portion 124 (i.e., the first channel).

In this embodiment, the second channel 142 of the supporting piece 140 extends from the first opening 112 towards the second opening 113 and is coaxial with the first opening 112. In other words, the second channel 142 and the first opening 112 are disposed on a same axle line. The second channel 142 is adapted to contain the moving part 130. To be specific, a size of the second channel 142 is greater than or equal to a size of the moving part 130. As such, when the moving part 130 is movably disposed in the corresponding second channel 142, the moving part 130 may move away from the first opening 112 along the same axle line in the first direction D1 or move close to the first opening 112 in the second direction D2 in the second channel 142. In this way, after passing through the first opening 112 to push the moving part 130, the airflow W enters the second portion 124 (i.e., the first channel) from the second channel 142 to flow towards the second opening 113. Alternatively, the backflow generated by the airflow W may enter the second portion 124 from the second opening 113 and then enters the second channel 142 to flow towards the first opening 112 to push the moving part 130 to move towards and to block the first opening 112, so as to prevent subsequent backflow from being generated.

With reference to FIG. 2, FIG. 3, FIG. 4A, and FIG. 4B, the backflow prevention device 100 may selectively include the stopper 150 in this embodiment. The stopper 150 is disposed on the channeled body 110 and is located next to the second opening 113. To be specific, the stopper 150 includes a ventilator 152, and the airflow W flowing in the first direction D1 may flow away from the second opening 113 through the ventilator 152. The moving part 130 is adapted to be restrained by the stopper 150 to be detached from a chamber 120 from the second opening 113. For instance, the stopper 150 is disposed at the second opening 113 and thus further forms a cover-like structure at the second opening 113. The airflow W may flow out of the second portion 124 by passing through the ventilator 152, but the moving part 130 is restrained by the stopper 150 and thus is remained in the second portion 124.

In this embodiment, the backflow prevention device 100 may selectively include the supporting piece 140 and the stopper 150, and the stopper 150 may fix the supporting piece 140 onto the channeled body 110 as shown in FIG. 1, FIG. 2, FIG. 3, FIG. 4A, and FIG. 4B. Nevertheless, the disclosure should not be construed as limited thereto. In the embodiments that are not shown, the backflow prevention device 100 may include the channeled body 110, the moving part 130, and the supporting piece 140 or may include the channeled body 110, the moving part 130, and the stopper 150. That is, the supporting piece 140 and the stopper 150 are selectively disposed. Note that the backflow prevention device 100 includes the supporting piece 140 with a height equal to a height of the first opening 140. When backflow occurs, the moving part 130 may easily be pushed by the airflow W to move towards the first opening 112 along the second channel 142. In other embodiments, the backflow prevention device 100 may not have to include the supporting piece 140. The moving part 130 freely moves in the second portion 124, and if a strong backflow occurs, the moving part 130 may still be able to move towards the first opening 112 along the inclined surface of the second portion 124 to block the first opening 112 and to prevent subsequent backflow from being generated.

Figure 4C:
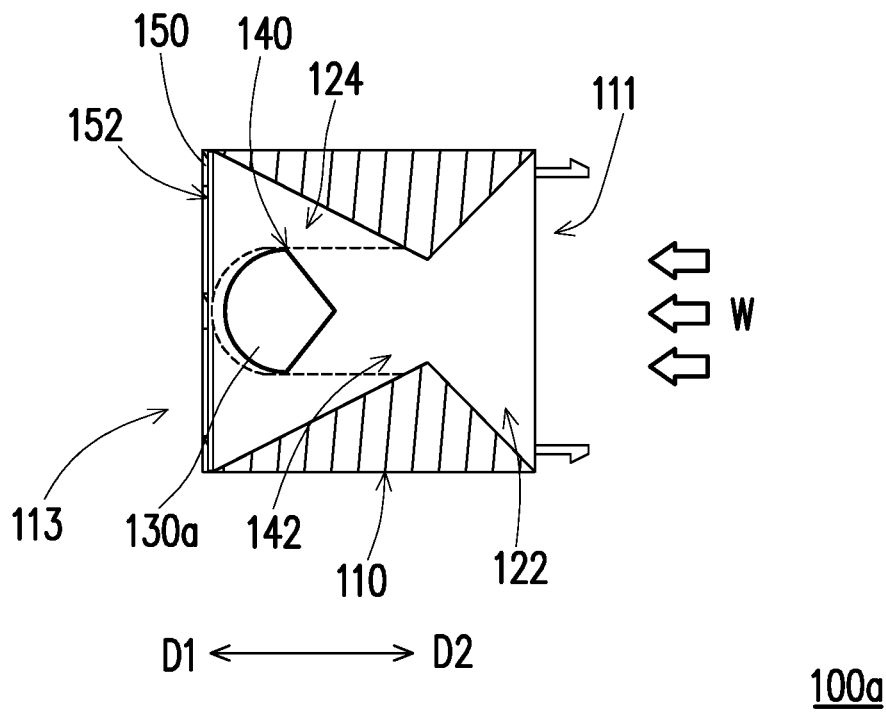
FIG. 4C is a schematic cross-sectional view illustrating a backflow prevention device according to another embodiment of the disclosure.

FIG. 4C is a schematic cross-sectional view illustrating a backflow prevention device according to another embodiment of the disclosure. With reference to FIG. 4A and FIG. 4C, a backflow prevention device 100a of this embodiment is similar to the backflow prevention device 100 of FIG. 4A, and a difference therebetween includes that: a moving part 130a is shaped as a cone in this embodiment. To be specific, the moving part 130a has two ends opposite to each other, wherein one end faces the third opening 111, and the other end faces the second opening 113. The cone-shaped moving part 130 has a greater surface area. As such, the area subjected to airflow increases, and that the moving part 130a may be easily pushed by the airflow W to move in the first direction D1 or in the second direction D2, and outflow efficiency thereby increases. Note that FIG. 4C illustrates movement of the moving part 130a in the first direction D1 when the airflow W enters the first portion 122 from the third opening 111. In other embodiments, when the airflow W enters the second portion 124 from the second opening 113, the moving part 130a moves in the second direction D2.

Figure 4D:
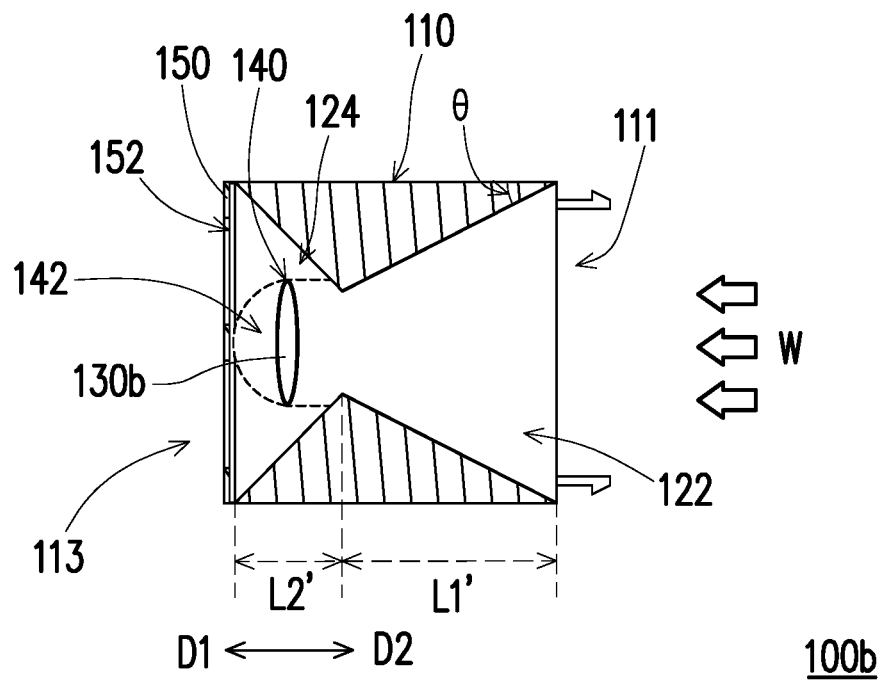
FIG. 4D is a schematic cross-sectional view illustrating a backflow prevention device according to another embodiment of the disclosure.

FIG. 4D is a schematic cross-sectional view illustrating a backflow prevention device according to another embodiment of the disclosure. With reference to FIG. 4A and FIG. 4D, a backflow prevention device 100b of this embodiment is similar to the backflow prevention device 100 of FIG. 4A, and a difference therebetween includes that: a moving part 130b is shaped as a disk, and a distance L1' between the first opening 112 and the second opening 113 is less than a distance L2' between the first opening 112 and the third opening 111 in this embodiment. To be specific, the moving part 130b shaped as a disk may have a thinner thickness in the first direction D1 when the moving part 130b is compared with the moving part 130 shaped as a sphere (as shown in FIG. 4A). That is, the distance L2' between the first opening 112 and the second opening 113 may be reduced to be less than the distance L1' between the third opening 111 and the first opening 112. In this way, a size of the channeled body 110 is further reduced and that the slim design is achieved, as such, the backflow prevention device 100b may be suitable for being applied to the fan 200 or being applied in other electronic devices (e.g., the server system 10 shown in FIG. 7). Note that FIG. 4D illustrates movement of the moving part 130b in the first direction D1 when the airflow W enters the first portion 122 from the third opening 111. In other embodiments, when the airflow W enters the second portion 124 from the second opening 113, the moving part 130b moves in the second direction D2.

In this embodiment, an angle θ of the backflow prevention device 100b may be less than the angle θ of the backflow prevention device 100 of FIG. 4A. That is, a slope of the backflow prevention device 100b at the first portion 122 may be less than the slope of the backflow prevention device 100 at the first portion 122. As such, in the backflow prevention device 100b, a drag force on the inclined surface of the first portion 122 may be reduced, and efficiency of the airflow W flowing from the first portion 122 to the second portion 124 is thereby increased.

Figure 5A:
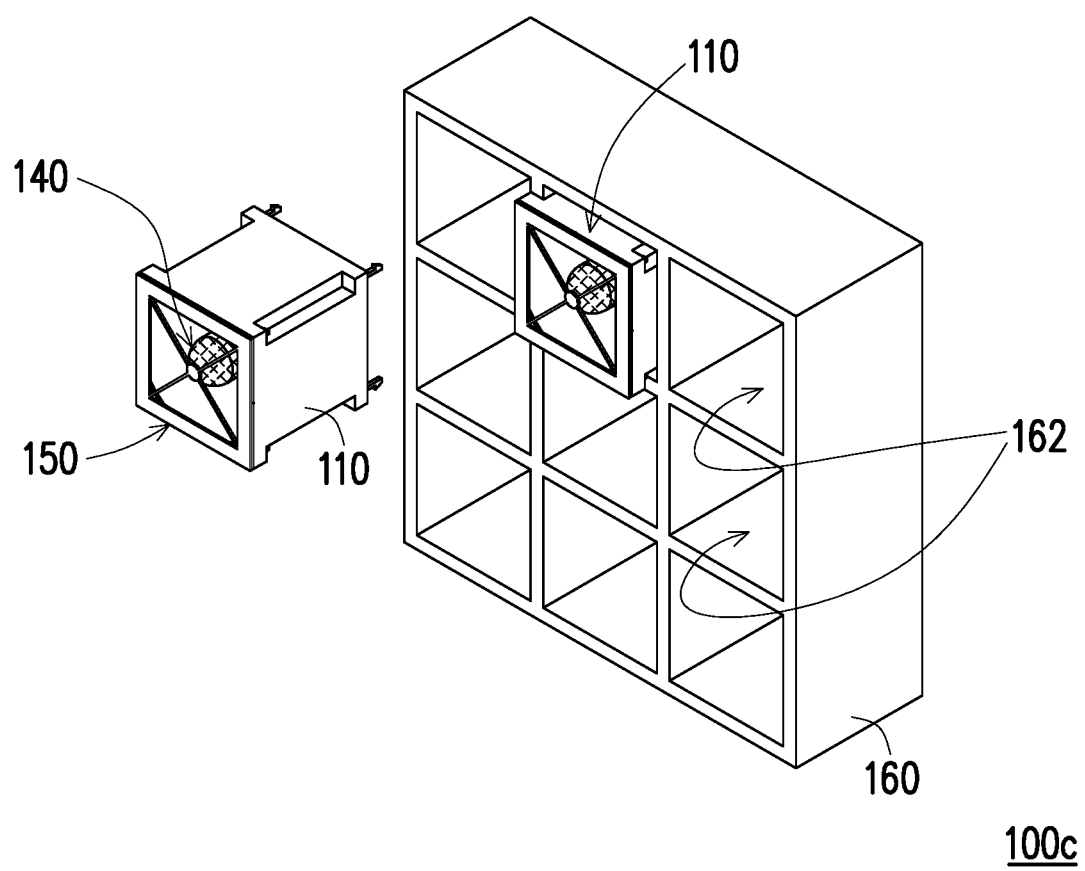
FIG. 5A is a schematic three-dimensional view illustrating a backflow prevention device according to an embodiment of the disclosure.

FIG. 5A is a schematic three-dimensional view illustrating a backflow prevention device according to an embodiment of the disclosure. With reference to FIG. 5A and FIG. 1, a backflow prevention device 100c of this embodiment is similar to the backflow prevention device 100 of FIG. 1, and a difference therebetween includes that: the backflow prevention device 100c further includes a frame 160 in this embodiment, and the frame 160 includes a plurality of accommodating slots 162 disposed in an array. The accommodating slots 162 are adapted to contain at least one channeled body 110. To be specific, the at least one channeled body 110 includes multiple channeled bodies 110, and the at least one moving part 130 includes multiple moving parts 130. The moving parts 130 are disposed in the channeled bodies 110, and the channeled bodies 150 and the moving parts 130 are replaceably inserted in the accommodating slots 162. As shown in FIG. 5A, a number of the accommodating slots 162 is greater than a number of the channeled bodies 110. For instance, FIG. 5A illustrates that two channeled bodies 110 are served as a module to be replaceably inserted in the accommodating slots 162, which should however not be construed as limitations to the disclosure.

In other embodiments, more channeled bodies 110 may all be inserted in all of the accommodating slots 162. In other words, the number of the accommodating slots 162 is equal to the number of the channeled bodies 110. Alternatively, only one channeled body 110 is inserted in one of the accommodating slots 162. In this way, a user (not shown) may determine the number of the channeled bodies 110 and positions of the channeled bodies 110 inserted in the accommodating slots 162 according to design of a fan (not shown) or other external electronic devices (not shown) as well as requirement for backflow prevention. As such, the backflow prevention device 100c may effectively prevent backflow from being generated without affecting a flow direction of the airflow W. Further, the flow direction of the airflow W may be effectively changed through accurately designing a position of a region with no backflow and with backflow being maintained according to the positions and the number of the channeled bodies 110 being disposed. Besides, as the channeled bodies 110 are designed to be replaceably inserted for instant adjustment, margin for the design of the flow direction of the airflow W as well as mobility of where the channeled bodies 110 are to be disposed may be further increased.

It should be noted that the reference numerals and a part of the contents in the previous embodiment are used in the following embodiments, in which identical reference numerals indicate identical or similar components, and the description of similar technical content should be referenced to the above-mentioned embodiments. A detailed description will not be repeated in the following embodiments.

Figure 5B:
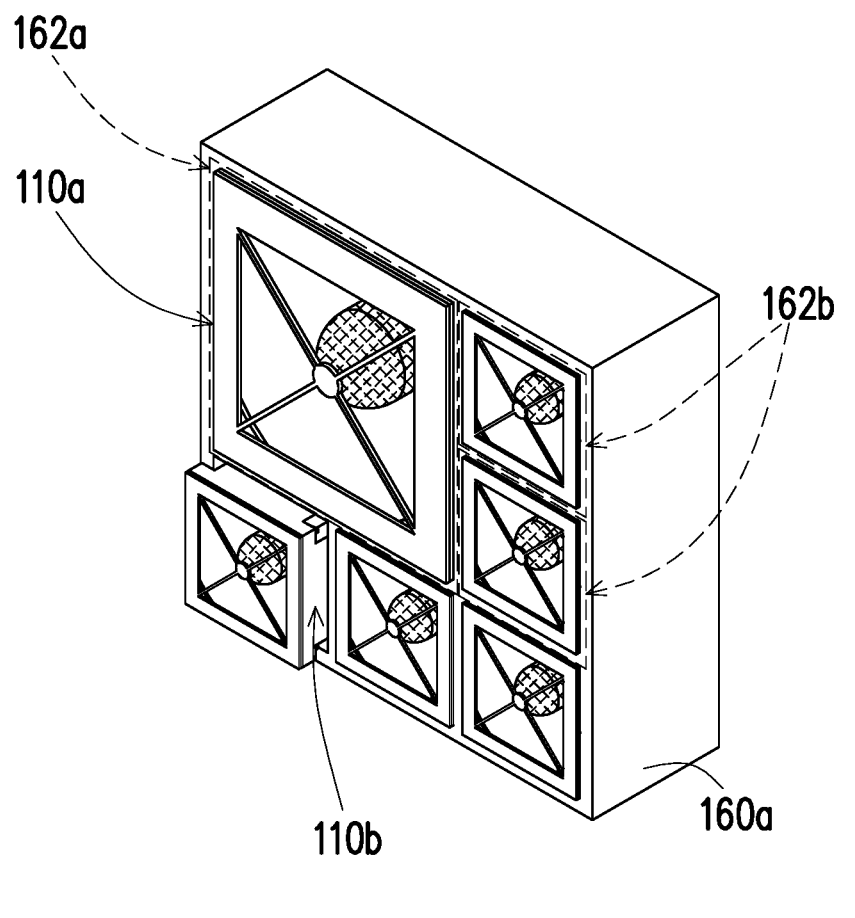
FIG. 5B is a schematic three-dimensional view illustrating a backflow prevention device according to another embodiment of the disclosure.

FIG. 5B is a schematic three-dimensional view illustrating a backflow prevention device according to another embodiment of the disclosure. With reference to FIG. 5B and FIG. 5A, a backflow prevention device 100d of this embodiment is similar to the backflow prevention device 100c of FIG. 5A, and a difference therebetween includes that: sizes of the accommodating slots 162 included in a frame 160a are different, and sizes of the channeled bodies 110 are also different in this embodiment. To be specific, the accommodating slots 162 include a first accommodating slot 162a and a second accommodating slot 162b. A size of the first accommodating slot 162a is greater than a size of the second accommodating slot 162b. The channeled bodies 110 include a first channeled body 110a and a second channeled body 110b. A size of the first channeled body 110a is greater than a size of the second channeled body 110b. In other words, the first channeled body 110a corresponds to the first accommodating slot 162a, and the second channeled body 110b corresponds to the second accommodating slot 162b.

As shown in FIG. 5B, the size of the first channeled body 110a is about the size of four second channeled bodies 110b combined, for example, and the first channeled body 110a is inserted in the first accommodating slot 162a. Moreover, the size of the first accommodating slot 162a is about the size of four second accommodating slots 162b combined, for example, which should however not be construed as limitations to the disclosure. In this way, if the first channeled body 110a with the greater size is disposed, backflow is entirely or partially prevented from being generated in the backflow prevention device 100d. In addition, in the backflow prevention device 100d of this embodiment, the sizes of the channeled bodies 110 are designed to be different for corresponding to different fans (not shown) or internal design of different electronic devices (not shown); as such, the margin for the design of the flow direction of the airflow W is increased.

Figure 6:
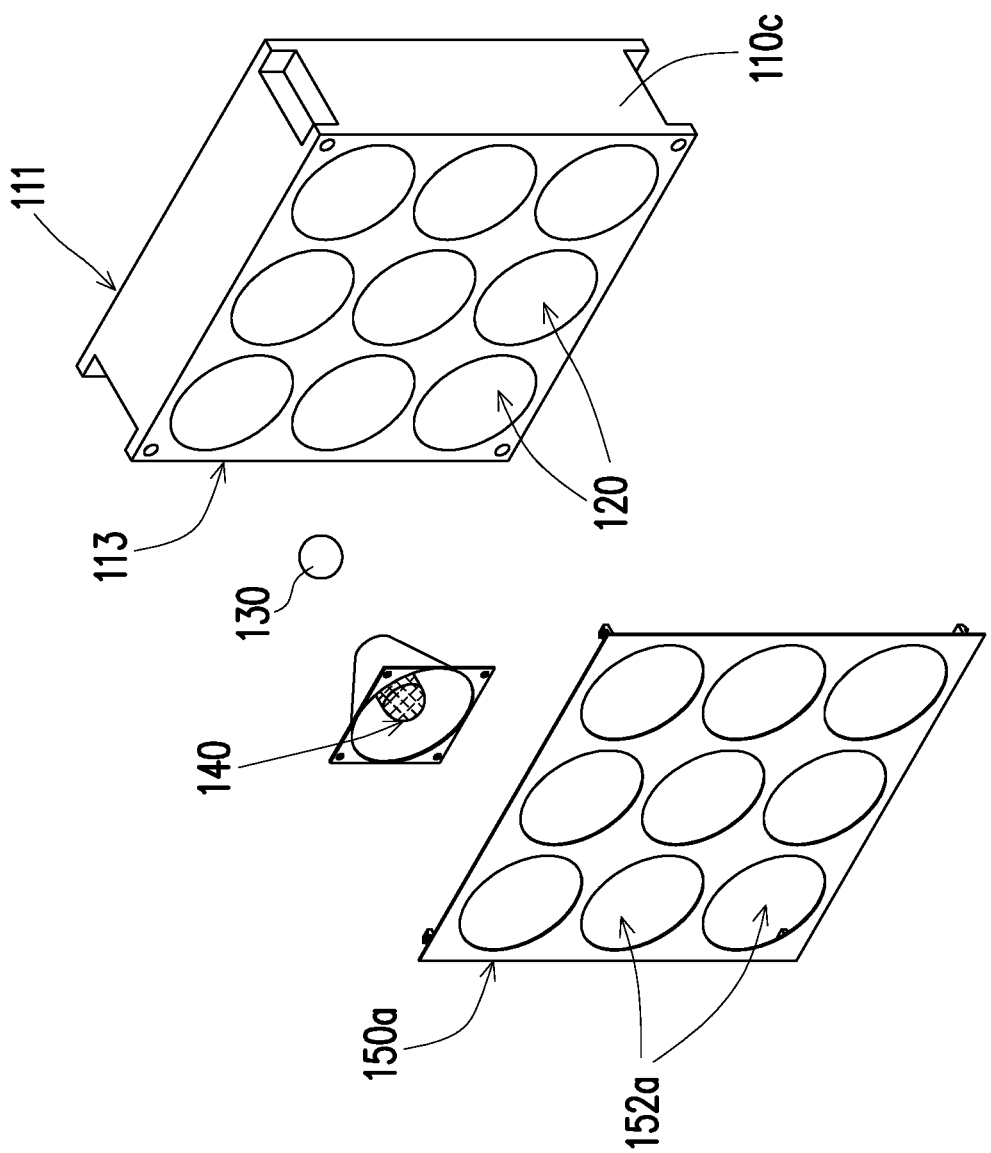
FIG. 6 is a schematic three-dimensional exploded view illustrating a backflow prevention device according to another embodiment of the disclosure.

FIG. 6 is a schematic three-dimensional exploded view illustrating a backflow prevention device according to another embodiment of the disclosure. With reference to FIG. 6 and FIG. 1, a backflow prevention device 100e of this embodiment is similar to the backflow prevention device 100c of FIG. 5A, and a difference therebetween includes that: a channeled body 110c includes multiple first openings 112, multiple second openings 113, and multiple third openings 111 in this embodiment. To be specific, the third openings 111 arranged in an array, the second openings 113, the first openings 112 located between the second openings 113 and the third openings 111, and the channels 120 connected to the second openings 113 and the third openings 111 are formed on the channeled body 110c. Each of the first openings 112, each of the second openings 113, and each of the third openings 111 are correspondingly formed on the channeled body 110c. In addition, each of the moving parts 130 is disposed in each of the channels 120 and is located between each of the first openings 112 and each of the second openings 113.

In this embodiment, at least one supporting piece 140 may be disposed on the corresponding channel 120, and at least one stopper 150 may be disposed on the channeled body 110c. The stopper 150 may include a plurality of ventilators 152a. A number of the channels 120 may be greater than or equal to a number of the moving parts 130. In other words, each of the moving parts 130 may selectively be disposed or not to be disposed on each of the channels 120. In this way, similar technical effects provided in the foregoing embodiments may also be obtained by the backflow prevention device 100e.

Figure 7:
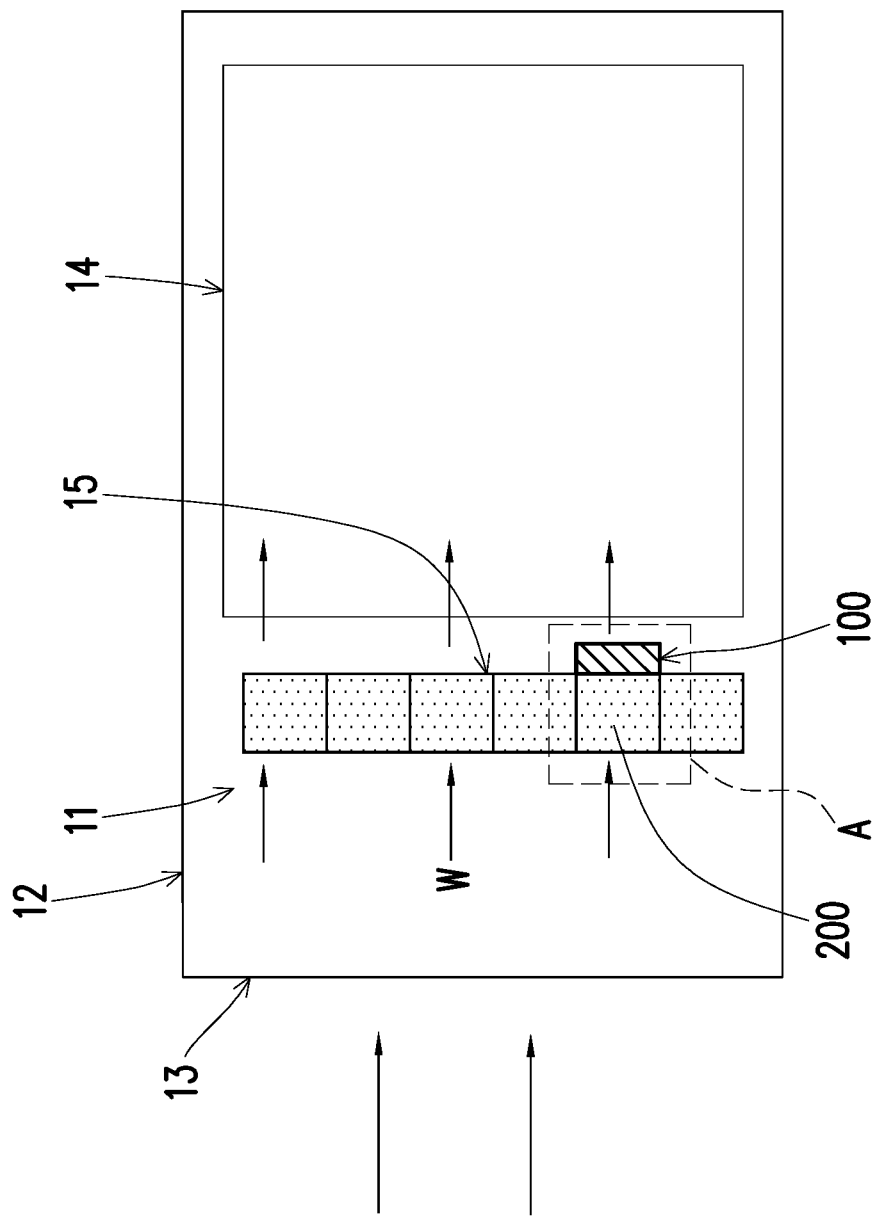
FIG. 7 is a schematic cross-sectional view illustrating a server system according to an embodiment of the disclosure.

FIG. 7 is a schematic cross-sectional view illustrating a server system according to an embodiment of the disclosure. With reference to FIG. 1 and FIG. 7, in this embodiment, the server system 10 includes a housing 12, a flow inlet 13, a main board 14, a fan 200, and the backflow prevention device 100 as shown in FIG. 1. The housing 12 includes an internal space 11. The flow inlet 13 is disposed in the housing 12. For instance, the flow inlet 13 is connected to the internal space 11 in the housing 12 and an external environment (not shown) of the housing 12. The main board 14 is disposed in the internal space 11. Moreover, a plurality of electronic components (not shown) may be disposed on the main board 14, and heat energy generated by the operation of the electronic components may be removed through the fan 200. To be specific, the fan 200 is disposed in the internal space 11 and is adjacent to the flow inlet 13. The fan 200 includes an outflow side 15, and the main board 14 is located next to the outflow side 15. In other words, the airflow W flowing from the flow inlet 13 into the internal space 11 may be exhausted from the outflow side 15 after being pulled in by the fan 200, and a wind blowing towards the main board 14 is thereby formed. The airflow W flowing towards the main board 14 may remove the heat energy generated by the electronic components on the main board 14.

Note that owing to the location in which the fan 200 is disposed, the design of the internal space 11 of the housing 12, and arrangement of the electronic components on the main board 14, unexpected backflow may be generated by the airflow W in a region A. As such, in this embodiment, the backflow prevention device 100 can be disposed in the region A in the internal space 11, so as to effectively prevent the backflow from being generated and increase heat dissipation efficiency of the fan 200 in the region A. Nevertheless, the disclosure should not be construed as limited thereto. In other embodiments, plural backflow prevention devices 100 may be disposed at the corresponding fans 200 by the user according to requirement of the server system 10 for accurately controlling the flow direction of the airflow W. For instance, backflow is prevented from being generated in a region in which the backflow prevention device 100 is disposed, and backflow is maintained in a backflow generating region in which no backflow prevention device 100 is disposed. As such, as the region allowing backflow and the region with no backflow are designed to exist in the internal space 11, the flow direction of the airflow W is effectively changed in the internal space 11. In addition, a number of the region with no backflow generated may be increased or decreased, and that an amount of flow of the airflow W may be further adjusted. Therefore, in the server system 10, the heat energy generated on the main board 14 may be removed more effectively, damage made by the heat energy on the main board 14 and the electronic components is reduced, and that service life and performance of the server system 10 are increased.

In view of the foregoing, the backflow prevention device provided by the embodiments of the disclosure includes at least one channeled body and at least one moving part. The channeled body includes the first opening and the second opening, and the channeled body gradually enlarges from the first opening to the second opening. The moving part is moveably disposed in the channeled body between the first opening and the second opening. The size of the moving part is greater than the size of the first opening. In this way, when the airflow flows from the first opening towards the second opening, the moving part may be driven by the airflow to move away from the first opening, and that smooth air circulation in the first opening is maintained. When backflow is generated by the airflow and the airflow flows from the second opening back to the first opening, the moving part may be pushed by the airflow towards the first opening to block the first opening. As such, additional active switch is not required to be disposed on the moving part to prevent backflow from being generated, and the flow direction of the airflow is also maintained. It thus can be seen that simplified design is provided, manufacturing costs are reduced, and heat dissipation efficiency is increased. In addition, the backflow prevention device provided by the embodiments of the disclosure further includes a plurality of channeled bodies or channels disposed in an array. In the backflow prevention device, the positions where the channeled bodies are inserted may be replaced (modularizing the backflow prevention device), or the moving parts may be disposed or may not be disposed in the channels, as such, backflow is entirely or partially prevented from being generated. Moreover, the flow direction or the amount of flow of the airflow may also be adjusted as required by the user. Accordingly, the backflow prevention device may be movably disposed corresponding to the region in which backflow is generated in the electronic device, and that the margin for the design of the flow direction of the airflow is further increased. The server system provided by the embodiments of the disclosure includes the backflow prevention device, and that backflow may be entirely or partially prevented from being generated, so as to precisely control the flow direction of the airflow. Therefore, in the server system, the heat energy generated may be removed more effectively, damage made by the heat energy to the electronic components in the server system is reduced, and that service life and performance of the server system are further increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A backflow prevention device adapted to an electronic device, comprising:
    at least one channeled body, each of the at least one channeled body comprising:
        at least one first opening; and
        at least one second opening, wherein each of the at least one channeled body gradually enlarges from the at least one first opening to the at least one second opening; and
    at least one moving part, each of the at least one moving part being movably disposed in each of the at least one channeled body, a size of the at least one moving part being greater than a size of the at least one first opening, the size of the at least one moving part being less than a size of the at least one second opening,
    an airflow from the electronic device driving each of the at least one moving part to enable each of the at least one moving part to block each of the at least one first opening when the airflow back flows from each of the at least one second opening to each of the at least one first opening of the at least one channeled body.

2. The backflow prevention device as claimed in claim 1, wherein the at least one channeled body further comprises:
    at least one third opening, each of the at least one first opening being located between each of the at least one second opening and each of the at least one third opening, and each of the at least one channeled body gradually shrinking from each of the at least one third opening to each of the at least one first opening.

3. The backflow prevention device as claimed in claim 2, wherein a diameter of each of the at least one second opening or each of the at least one third opening is R1, a diameter of each of the at least one first opening is R2, and $0.4R1 \leq R2 \leq 0.6R1$.

4. The backflow prevention device as claimed in claim 2, wherein a slope of the at least one channeled body from each of the at least one second opening to each of the at least one first opening or from each of the at least one third opening to each of the at least one first opening is between 0.7 and 1.43.

5. The backflow prevention device as claimed in claim 1, further comprising:
    at least one supporting piece, each of the at least one channeled body having at least one first channel, each of the at least one first channel being connected to the corresponding at least one first opening and the corresponding at least one second opening, each of the at least one supporting piece being disposed in the corresponding at least one first channel, each of the at least one supporting piece surrounding a second channel, the second channel corresponding to the at least one first opening and extending towards the at least one second opening and being coaxial with the corresponding at least one first opening, a plurality of through holes being formed on each of the at least one supporting piece, the through holes enabling the second channel of each of the at least one supporting piece to be connected to the corresponding at least one first channel, and each of the at least one moving part being movably disposed in the corresponding second channel.

6. The backflow prevention device as claimed in claim 1, further comprising:
at least one stopper, disposed on the at least one channeled body and located next to the at least one second opening, each of the at least one stopper comprising a ventilator, and the at least one moving part being adapted to be restrained by the at least one stopper and that being not detached from the at least one channeled body from the at least one second opening.

7. The backflow prevention device as claimed in claim 1, wherein each of the at least one moving part is a sphere, a cone, or a disk.

8. The backflow prevention device as claimed in claim 1, further comprising:
a frame, comprising a plurality of accommodating slots, the at least one channeled body comprising a plurality of channeled bodies, the at least one moving part comprising a plurality of moving parts, each of the plurality of moving parts correspondingly disposed in each of the plurality of channeled bodies, and each of the channeled bodies and the correspondingly moving parts are being replaceably inserted into one of the plurality of accommodating slots,
wherein, a number of the accommodating slots is greater than a number of the channeled bodies.

9. The backflow prevention device as claimed in claim 8, wherein the accommodating slots comprise a first accommodating slot and a second accommodating slot, a size of the first accommodating slot is greater than a size of the second accommodating slot, the channeled bodies comprise a first channeled body and a second channeled body, and a size of the first channeled body is greater than a size of the second channeled body.

10. The backflow prevention device as claimed in claim 1, wherein a main body of the at least one channeled body is one channeled body, the at least one channeled body further comprises at least one third opening, the at least one first opening is located between the at least one second opening and the at least one third opening, the at least one first opening, the at least one second opening, and the at least one third opening respectively comprise a plurality of first openings, a plurality of second openings, and a plurality of third openings, and the first openings, the second openings, and the third openings are formed on the at least one channeled body.

11. A server system, comprising:
a housing;
a flow inlet, disposed in the housing;
a main board, disposed in the housing;
a fan, disposed in the housing near the flow inlet, the fan comprising an outflow side, the main board being located next to the outflow side; and
a backflow prevention device as claimed in claim 1, disposed in the housing and disposed at the outflow side of the fan.

12. The server system as claimed in claim 11, wherein the at least one channeled body of the backflow prevention device further comprises:
at least one third opening, each of the at least one first opening being located between each of the at least one second opening and each of the at least one third opening, and each of the at least one channeled body gradually shrinking from each of the at least one third opening to each of the at least one first opening.

13. The server system as claimed in claim 12, wherein a diameter of each of the at least one second opening or each of the at least one third opening is R1, a diameter of each of the at least one first opening is R2, and $0.4R1 \leq R2 \leq 0.6R1$.

14. The server system as claimed in claim 12, wherein a slope of the at least one channeled body from each of the at least one second opening to each of the at least one first opening or from each of the at least one third opening to each of the at least one first opening is between 0.7 and 1.43.

15. The server system as claimed in claim 11, further comprising:
at least one supporting piece, each of the at least one channeled body having at least one first channel, each of the at least one first channel being connected to the corresponding at least one first opening and the corresponding at least one second opening, each of the at least one supporting piece being disposed in the corresponding at least one first channel, each of the at least one supporting piece surrounding a second channel, the second channel corresponding to the at least one first opening and extending towards the at least one second opening and being coaxial with the corresponding at least one first opening, a plurality of through holes being formed on each of the at least one supporting piece, the through holes enabling the second channel of each of the at least one supporting piece to be connected to the corresponding at least one first channel, and each of the at least one moving part being movably disposed in the corresponding second channel.

16. The server system as claimed in claim 11, further comprising:
at least one stopper, disposed on the at least one channeled body and located next to the at least one second opening, each of the at least one stopper comprising a ventilator, and the at least one moving part being adapted to be restrained by the at least one stopper and that being not detached from the at least one channeled body from the at least one second opening.

17. The server system as claimed in claim 11, wherein each of the at least one moving part is a sphere, a cone, or a disk.

18. The server system as claimed in claim 11, further comprising:
a frame, comprising a plurality of accommodating slots, the at least one channeled body comprising a plurality of channeled bodies, the at least one moving part comprising a plurality of moving parts, each of the plurality of moving parts correspondingly disposed in each of the plurality of channeled bodies, and each of the channeled bodies and the correspondingly moving parts are being replaceably inserted into one of the plurality of accommodating slots,
wherein, a number of the accommodating slots is greater than a number of the channeled bodies.

19. The server system as claimed in claim 18, wherein the accommodating slots comprise a first accommodating slot and a second accommodating slot, a size of the first accommodating slot is greater than a size of the second accommodating slot, the channeled bodies comprise a first channeled body and a second channeled body, and a size of the first channeled body is greater than a size of the second channeled body.

20. The server system as claimed in claim 1, wherein a main body of the at least one channeled body is one channeled body, the at least one channeled body further comprises at least one third opening, the at least one first opening is located between the at least one second opening and the at least one third opening, the at least one first opening, the at least one second opening, and the at least one third opening respectively comprise a plurality of first openings, a plurality of second openings, and a plurality of third openings, and the first openings, the second openings, and the third openings are formed on the at least one channeled body.

* * * * *